(12) United States Patent
De Vries et al.

(10) Patent No.: US 7,688,083 B2
(45) Date of Patent: Mar. 30, 2010

(54) ANALOGUE MEASUREMENT OF ALIGNMENT BETWEEN LAYERS OF A SEMICONDUCTOR DEVICE

(75) Inventors: Dirk Kenneth De Vries, St-Georges-d'Orques (FR); Albert Van De Goor, Wijchen (NL)

(73) Assignee: NXP B.V., Eindhoven (NL)

( * ) Notice: Subject to any disclaimer, the term of this patent is extended or adjusted under 35 U.S.C. 154(b) by 74 days.

(21) Appl. No.: 11/575,863

(22) PCT Filed: Sep. 19, 2005

(86) PCT No.: PCT/IB2005/053073

§ 371 (c)(1),
(2), (4) Date: Sep. 22, 2008

(87) PCT Pub. No.: WO2006/033073

PCT Pub. Date: Mar. 30, 2006

(65) Prior Publication Data
US 2009/0009196 A1    Jan. 8, 2009

(30) Foreign Application Priority Data
Sep. 23, 2004    (EP) .................................. 04300618

(51) Int. Cl.
G01R 27/08    (2006.01)
G01R 31/28    (2006.01)
(52) U.S. Cl. .................................. 324/699; 324/158.1

(58) Field of Classification Search .................. 324/765, 324/158.1, 699; 438/14–18, 59, 672; 700/121; 257/48
See application file for complete search history.

(56) References Cited

U.S. PATENT DOCUMENTS

| 6,221,681 B1 | 4/2001 | Sugasawara |
| 6,878,561 B2 * | 4/2005 | Look et al. ..................... 438/14 |
| 7,427,857 B2 * | 9/2008 | Amato ..................... 324/158.1 |

OTHER PUBLICATIONS

Freeman et al: "Experimental Verification of a Novel Electrical Test Structure for Measuring Contact Size"; IEEE Transactions Semic. Manuf.; vol. 2 No. 1; Feb. 1989; pp. 9-15.

* cited by examiner

Primary Examiner—Ha Tran T Nguyen
Assistant Examiner—Tung X Nguyen

(57) ABSTRACT

A method of obtaining parametric test data for use in monitoring alignment between layers of a semiconductor device. The method employs a test structure comprising a meander (10, 30) of the material of a first layer of the semiconductor device, deposited relative to a conductive line (18,38). A number of sets (16a, 16b, 16e, 16d) of components 16, such as contacts or vias, are provided relative to the meander (10), at successively smaller distances therefrom. A single analogue measurement can be performed between a first and (A) of the meander (10, 30) and the conductive line (18, 38) so as to determine the resistance therebetween, and the critical distance at (or on acceptable margin in relation thereto) between the first layer and a component of the semiconductor device can be obtained.

18 Claims, 4 Drawing Sheets

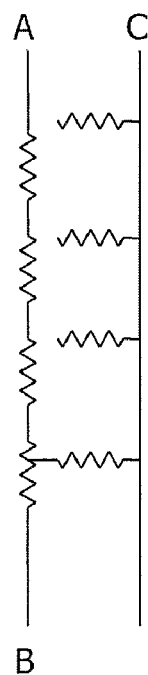
FIG. 3
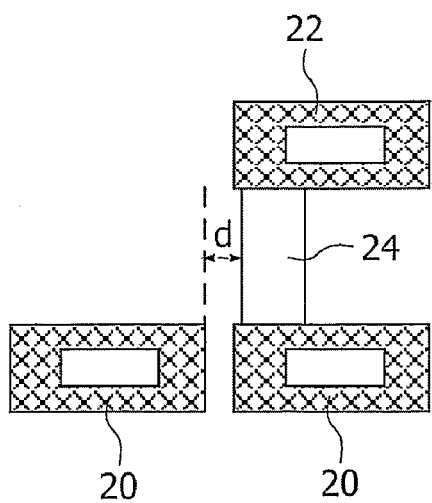 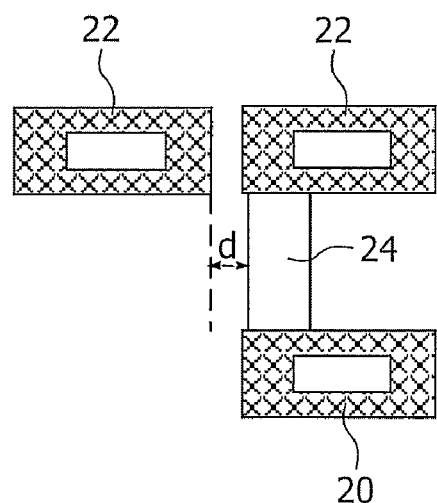
FIG. 4a   FIG. 4b

ANALOGUE MEASUREMENT OF ALIGNMENT BETWEEN LAYERS OF A SEMICONDUCTOR DEVICE

FIELD OF THE INVENTION

This invention relates generally to the analogue measurement of alignment between layers of a semiconductor device and, more particularly, to a method of determining a critical distance or allowable margin between layers of a semiconductor device by means of an analogue measurement performed in respect of a test structure, and a test structure for use in such a method.

BACKGROUND OF THE INVENTION

Modern integrated circuits are typically fabricated in multiple layers on a semiconductor (e.g. Silicon) wafer. During fabrication of an integrated circuit die, lithographic processes are widely used to lay down successive circuit layers that together define electronic devices on the integrated circuit die. During the fabrication process, a different mask is used to pattern each layer. Misalignment between successive layers of the integrated circuit die, which is caused by misalignment between the masks that define the various device layers, is present in substantially all integrated circuit dies to some degree. There is, however, a tolerable amount of misalignment that may exist in any given integrated circuit die before operation of the integrated circuit die is jeopardized.

In semiconductor manufacturing, the overlay between lithographically defined layers becomes more critical as lateral dimensions shrink in current and future technology nodes. In the 65 nm CMOS technology node, for example, poly-to-contact (poly stands for poly-Silicon which is the gate material) overlay becomes one of the most critical parameters for yield.

Referring to FIG. 1 of the drawings, there is provided a schematic cross-sectional view of a portion of an integrated circuit die configuration which is particularly sensitive to poly-to-contact short circuits due to misalignment of the respective layers of the integrated circuit die. The structure comprises a semiconductor substrate 100 typically of monocrystalline Silicon, in which at least one isolation means 101, such as "shallow trench isolation" or STI, is formed to electrically separate, for example, n-type regions (not shown) and p-type regions (not shown) in a CMOS device, such regions being formed in the substrate 100 by, for example, conventional dopant diffusion or implantation. An active device 102 in the form of, for example, an NMOS or PMOS transistor is provided on the substrate 100, which device comprises a gate electrode structure 103 (formed by, for example, a conventional gate and spacer etching process) with a layer of poly-Silicon gate material 104. Conventional Metal-Oxide Semiconductor Field-Effect Transistors (MOSFETs) utilize poly-Silicon for forming gate electrodes, in view of its good thermal stability. In addition, poly-Silicon-based materials advantageously block implantation of dopant ions into the underlying channel region of the transistor, thereby facilitating the formation of self-aligned source and drain regions after gate electrode deposition/patterning is completed.

An integrated circuit is typically fabricated by etching trenches in a semiconductor substrate, in patterns defined by a photo-mask, then filling these trenches by an isolating material to realize electrically isolated active areas. Ion implantation is used to dope these areas as n-type or p-type. The active areas are then oxidized, after which step a gate material is deposited. A subsequent photolithography and anisotropic etching step is used to selectively remove gate material in order to construct, amongst other devices, field-effect transistors. Masked ion implantation steps are performed to highly dope the gate patterns and those active areas which are not covered by gate patterns, after which the formed transistors as well as other active and passive devices are interconnected as required, through respective contacts, by interconnection lines. Accordingly, in the structure illustrated in FIG. 1 of the drawings, the active device 102 is connected to the metal interconnecting line 105 by means of a contact 106 extending from the surface of the substrate 100.

In the exemplary structure shown, there is a critical distance d between the gate material 104 and the contact 106. Since the gate material and contact regions are patterned in separate lithographic steps, poly-to-contact shorts can be caused by misalignment between the respective patterns (which causes the distance between the gate material 104 and the contact 106 to be less than the critical distance), in addition to variation of the lateral dimensions of the gate 104 and contact 106.

For the 65 nm technology node, the minimal design rule for poly-to-contact distance d is very close to the accuracy capability of conventional lithographic tools and it is therefore imperative to have an adequate quantification of the distance between poly and respective contacts (and/or other critical electrical distances, such as, via-to-metal) in order to properly control the process and have a good diagnosis capability if an issue should arise. This quantification should ideally be possible in an early stage of the fabrication process (parametric test) and have acceptable process overheads in terms of measurement cost and time.

In one known method, during process development, a set of parametric test structures is used in which the poly-to-contact distance is systematically varied. The resultant test structures are placed on development reticules, which have a large fraction of their surface dedicated to engineering purposes, and measurements are performed on an individual basis in respect of the test structures to create a set of parametric test data defining the acceptable margin of variation in the critical distance. This is an expensive approach in terms of time and Silicon area, and as a result tends not to be used in production.

Other known methods describe the combination of poly-contact distance variations in a single "vernier" test structure combined with a digital test. It will be appreciated by a person skilled in the art that a vernier test structure is based on a well-known precision measurement method using interference patterns. In this approach, a large number of measurements, performed on digital remain measurement equipment, is necessary to determine the actual overlay margin; however, due to the requirement for digital measurement equipment, which is incompatible with parametric test equipment, such structures also are not generally used in production.

U.S. Pat. No. 6,221,681 relates to on-chip misalignment indication using misalignment circuit indicators fabricated in layers of an integrated circuit die wherein a current between two contacts varies as resistance between the contacts varies as a function of misalignment. Experimentation with varying degrees of misalignment results in a determination of a maximum and minimum amount of current between the contacts at a given voltage. The maximum and minimum amounts of current correspond to maximum misalignments in one and the other directions along the coordinate axis. Thus, the maximum and minimum amounts of current define an acceptable range of misalignment between successive layers. If the amount of current between the two contacts is either greater than the maximum amount of current or less than the minimum amount of current for a given voltage applied between the two contacts, misalignment between successive layers is considered to be out of tolerance, and the integrated circuit die is considered to have failed misalignment testing. In the described arrangement, there is provided a plurality of on-chip misalignment circuit indicators, each comprising a first conductor connecting a first contact region to a first pad and a second conductor connecting a second contact region to a second pad. The on-chip misalignment indicators may comprise any type of appropriate semiconductor device in which the current path through the device varies dependent upon the length, and hence the resistance, between locations in the device. Current measurements need to be performed in respect of each on-chip misalignment indicator, and at least one but more preferably a set of misalignment indicators are provided to detect misalignment along each respective coordinate axis of the integrated circuit die.

However, in addition to the fact that the arrangement described in U.S. Pat. No. 6,221,681 is concerned with the occurrence of unintentionally high resistance between layers of the device which are intended to be contacted, it is focused on separately tested test structures, i.e. it works with multiple measurements, one for each overlay variant, which is costly, particularly in terms of time.

SUMMARY OF THE INVENTION

On the contrary, the present invention is primarily concerned with the determination of the probability or likelihood of unintentional shorts between layers not intended to be in contact with each other, and it is an object of the present invention to provide a more cost-effective method of obtaining parametric test data in respect of a semiconductor device structure, and thereby quantifying misalignment of successively deposited layers of a semiconductor device. It is also an object of the present invention to provide a test structure for use in the above-mentioned method, a method of fabricating such a test structure, a method and apparatus for testing a semiconductor device structure using the parametric test data obtained by means of the above-mentioned method, a method of fabricating an integrated circuit including one or more semiconductor device structures tested using the parametric test data obtained by means of the above-mentioned method, and an integrated circuit die fabricated by such a method.

In accordance with the present invention, there is provided a method of obtaining parametric test data for use in monitoring alignment of first and second layers of material successively deposited on a substrate defining two respective non-contacting component types on an integrated circuit die, the method comprising providing a test structure comprising a conductive first line, a second line of the material of said first layer of material, and a plurality of component regions, each component region comprising one or more components defined by said second layer of material and being provided on said conductive first line relative to said second line of material, wherein a first component region is located at a first distance from said second line of material and a second component region is located in contact with said second line of material, said second line of material defining a resistance between said first and second component regions, the method further comprising performing a single analogue measurement between said conductive first line and said second line of material so as to measure the resistance therebetween, said resistance being indicative of a probability of a short circuit occurring between said first and second layers of material depending upon the distance therebetween.

Also in accordance with the present invention, there is provided a test structure for use in the above-mentioned method, the test structure comprising a conductive first line, a second line of the material of said first layer of material, and a plurality of component regions, each component region comprising one or more components defined by said second layer of material and being provided on said conductive first line relative to said second line of material, wherein a first component region is located at a first distance from said second line of material and a second component region is located in contact with said second line of material, said second line of material defining a resistance between said first and second component regions, the test structure further comprising means for enabling a single analogue measurement to be performed between said conductive first line and said second line of material so as to measure the resistance therebetween.

The present invention also extends to an analogue signal including parametric test data obtained by means of the above-mentioned method, and to the use of parametric test data obtained by means of the above-mentioned method in monitoring alignment of a first and second deposited layers of a semiconductor device structure.

The present invention extends still further to a method of, and apparatus for, monitoring alignment of first and second deposited layers of a semiconductor device structure using the parametric data obtained by means of the above-mentioned method, and further still to a method of fabricating an integrated circuit die comprising a plurality of semiconductor device structures, the method including monitoring alignment of first and second deposited layers of one or more of the semiconductor device structures using parametric data obtained using the above-mentioned method, and an integrated circuit die manufactured according to such a method.

Thus, the present invention provides an approach to misalignment quantification, in which only a single analogue measurement is required to be performed in order to obtain a misalignment margin in respect of two, separately deposited layers of material of a semiconductor device, which layers are not intended to be in contact with each other, based on the analogue response of the test structure, so as to provide an indication of the probability of the occurrence of shorts (caused by excessive misalignment of the layers) in semiconductor device structures by testing thereof during manufacture. In other words, the parametric test data referred to above preferably comprises a critical distance in respect of the space between said first and second layers and/or an acceptable margin in respect of said critical distance based on the measured resistance of the second line of material at a given voltage.

In a preferred embodiment, one or more third component regions are located between said first and second component regions, said one or more third component regions being located at a distance from said second line of material which is less than said first distance. In one exemplary embodiment, two or more third component regions are located between said first and second component regions at successively smaller distances from said second line of material.

Beneficially, the resistance of said second line of material between the or each pair of component regions is at least of the order of the resistance of a short circuit between said first and second layers of material. As a result, the actual resistance of such a short circuit becomes relatively insignificant, such that the number of "high-resistance units" can be measured in a single analogue measurement. Preferably, the resistance of the second line of material is dependent upon the respective length of the second line of material.

The second line of material is preferably provided in a meandering configuration, having two or more elongate portions, which are preferably substantially parallel, with respective connecting portions therebetween, wherein at least one component region is preferably provided in respect of each elongate portion. The elongate portions are preferably transverse to the conductive first line of material, and preferably substantially perpendicular thereto. Each component region may comprise a row of respective components located relative to a respective elongate portion of said second line of material substantially parallel thereto. In one exemplary embodiment, two component regions are provided in respect of each elongate portion of said second line of material, one on each side thereof. This enables positive and negative misalignment to be measured at the same time.

Preferably, said single analogue measurement may be obtained between a first end of said second line of material and said conductive first line of material, additional measurements may be obtained between said first end and a second end of said second line of material to determine the total resistance of said second line of material. In addition, or alternatively, measurements may be obtained in respect of the individual resistances of selected portions, e.g. said elongate portions (by means of, for example, digital "tap off" fingers), of said second line of material, so as to enable the test structure to be calibrated.

In one exemplary embodiment, the method may be used in obtaining parametric data for monitoring alignment of a layer of gate material and a contact layer (i.e. poly-contact alignment). In another exemplary embodiment, the method may be used in obtaining parametric data for monitoring alignment of a metal layer and a via (i.e. metal-via alignment). In yet another exemplary embodiment, the method and test structure can be used for LIL (local interconnect realized in tungsten or other conducting material)-to-poly overlay.

These and other aspects of the present invention will be apparent from, and elucidated with reference to, the embodiments described herein.

BRIEF DESCRIPTION OF THE DRAWINGS

Embodiments of the present invention will now be described by way of examples only and with reference to the accompanying drawings, in which:

FIG. 3 is a schematic circuit diagram illustrating the electrical connectivity of the structure of FIG. 2;

FIG. 4a is a schematic cross-sectional illustration of a device structure which is sensitive to via-to-bottom metal shorts;

FIG. 4b is a schematic cross-sectional illustration of a device structure which is sensitive to via-to-top metal shorts;

DETAILED DESCRIPTION OF THE INVENTION

As it has been established above, good process monitoring capability is critical to the success of any state-of-the-art semiconductor fabrication process. Data is needed to control equipment variability, and to understand process limitations which influence design rules. However, as explained above, because of shrinking feature sizes and decreasing tolerances, adequate process monitoring is becoming increasingly difficult. It has been found that automated optical alignment measurements are frequently insufficient to guarantee a sufficient degree of electrical isolation between misaligned layers. One known arrangement comprising on-chip misalignment circuit indicators is described above in relation to U.S. Pat. No. 6,221,681. Another type of electrical test structure is proposed by G. Freeman, W. Lukaszek, T. W. Ekstedt and D. W. Peters, "Experimental verification of a novel electrical test structure for measuring contact size", IEEE Trans. Semic. Manuf., vol. 2, No. 1, February 1989, pp. 9-15, which is shown therein to be capable for use in measuring contact size. It is, however, also suitable for measuring, among other parameters, alignment. The structure proposed in the above-mentioned document is based on the concept of a digital vernier, and comprises a strip of poly-Silicon flanked on its two sides by rows of contacts, with each contact slightly offset from the one next to it. Two types of measurements are then made on this structure to determine contact size. The first is a continuity measurement between each contact and the poly strip. This determines which contacts on each side touch the poly and which do not. From this information, it is possible to determine where the edge of the poly lies relative to the contact edges. The second measurement is of the poly line-width. These two measurements can then be used to give the contact size.

Figure 1:
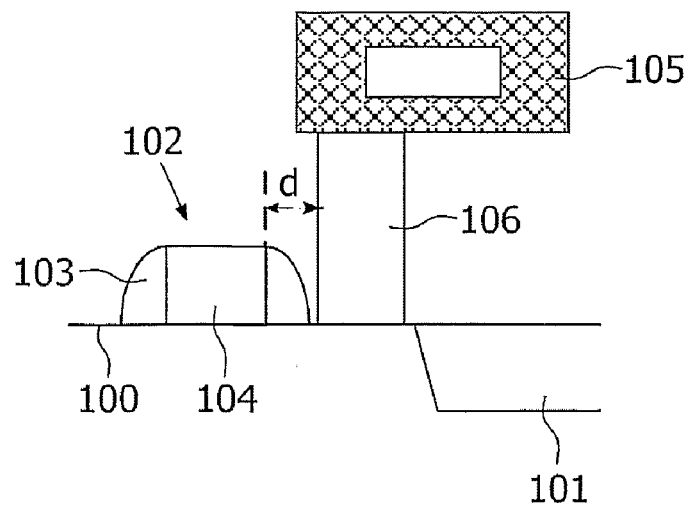
FIG. 1 is a schematic cross-sectional illustration of a semiconductor device structure which is sensitive to poly-to-contact shorts.
Figure 2:
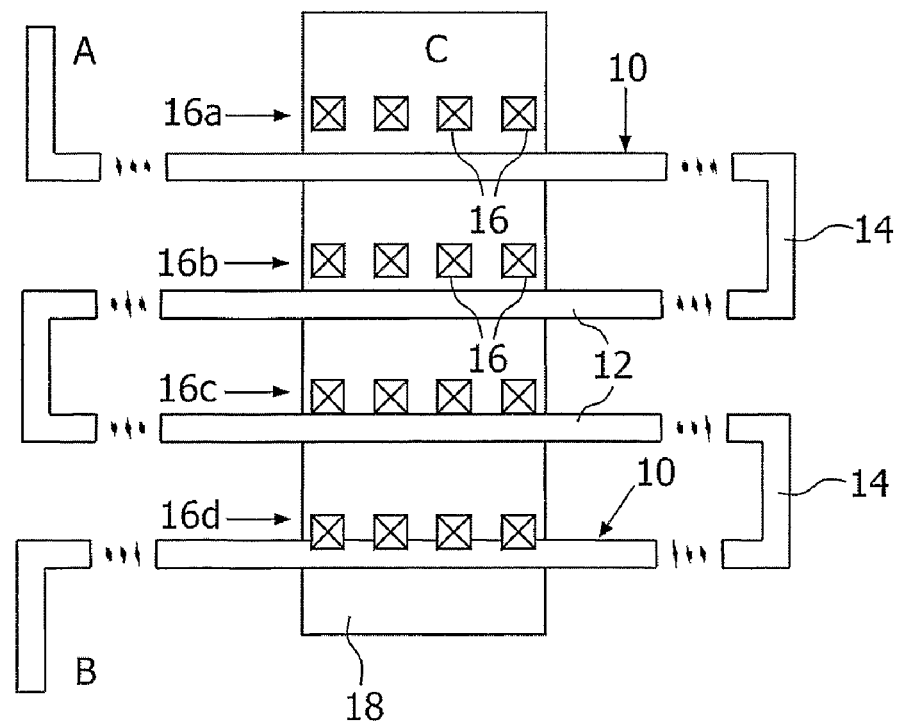
FIG. 2 is a schematic plan view of an electrical test structure according to a first exemplary embodiment of the present invention for use in measuring poly-to-contact alignment.

The following exemplary embodiment of the present invention effectively modifies the "vernier" layout of the test structure proposed in the above-mentioned reference to transform the digital overlay measurements into a single analogue measurement. Referring to FIG. 2 of the drawings, in the proposed structure according to a first exemplary embodiment of the present invention, a poly-Silicon line 10 of relatively narrow width is used, which is deposited on a semiconductor substrate in a meandering configuration, comprising a plurality of substantially parallel, substantially horizontal regions 12 and a plurality of connecting portions 14, between a first end A and a second end B.

With respect to each horizontal region 12 of the poly line 10, a set of contacts 16 is provided, the contact sets being placed at different distances relative to respective horizontal regions 12, as shown. It will be appreciated that the contacts 16 extend from the semiconductor substrate (not shown) to a relatively wide, conductive (metal-1) line 18. In the exemplary embodiment illustrated in FIG. 2, the distance between each contact set and the respective horizontal region 12 of the poly line 10 decreases sequentially and, in one embodiment, it may decrease sequentially from a first distance significantly greater than the critical poly-to-contact distance to the critical distance, which critical distance is the minimum poly-to-contact distance permitted before the likelihood of the occurrence of a poly-to-contact short is greater than some design minimum. Alternatively, the distance between each contact set and the poly line 10 may decrease in steps of one design grid, starting at a distance which is slightly relaxed with respect to a minimum design rule (i.e. greater than the above-mentioned critical distance), and ending at a zero nominal distance or even a slight overlap of the contact 16 on the poly 10, as shown in FIG. 2. The electrical connectivity of the proposed test structure illustrated in FIG. 2, is illustrated schematically in FIG. 3 of the drawings, which illustrates more clearly that a poly-to-contact short is introduced only in respect of contact group 16d, although the distance between contact group 16c and the poly line (or "meander") 10 is also less than the critical distance, such that the probability of a poly-to-contact short is relatively high.

By way of example only, an exemplary test structure might typically be produced as follows:

First step: realize the meander, for instance in poly, by depositing a layer of poly-crystalline Silicon, photolithographically defining the desired pattern, then etching away everything except the meander.

Second step: deposition of an electrically isolating and planarizing layer (often called "interlevel dielectric").

Third step: realize contacts by etching photolithographically defined holes in the isolating layer, then by filling these with a conductive material such as tungsten. (It is the overlay between these contacts and the poly meander that the test structure is intended to quantify).

Fourth step: realize the conductive line (18) in metal-1. In older CMOS technologies, this would be done by depositing Al—Cu, photolithographically masking the area which is to become the wide line, and etching away all other metal. In more recent technology nodes, this may be realized by depositing a second electrically isolating layer, etching a slit in this layer which is so deep as to expose the contacts, and to fill the slit by Copper Cu.

In contrast with prior art test structures, an intentionally significant resistance is introduced between the contact groups 16a-d (i.e. between potential points of poly-contact shorts) by, for example, a relatively long length of poly 10. This resistance is of the order of, or greater than, the potential poly-contact short resistance. By doing this, the actual resistance of the poly-contact short becomes relatively unimportant. This permits measurement of the number of "high-resistance units" in a single analogue measurement which is sufficient to detect the probability of poly-contact shorts through misalignment.

In the exemplary embodiment illustrated in FIG. 2 of the drawings, a single measurement of the resistance between terminal A (first end of the poly meander 10) and terminal C (on the metal-1 line 18) is sufficient to estimate the length of poly until the first shorting contact group. In other words, a single measurement between terminals A and C is sufficient to determine the critical poly-to-contact distance. Thus, the poly-to-contact margin can be quantified immediately. Even if the poly-to-contact short resistance is much higher for a marginally shorting contact (e.g. 16c) than for a properly targeted "contact to poly" (e.g. 16d), the analogue response of this test structure will depend in a continuous, uniformly increasing fashion on the poly-to-contact margin.

Thus, consider that the probability of a poly-to-contact short at the largest poly-contact distance provided on the test structure (which is known) is 0% and the probability of a poly-to-contact short at the targeted "contact to poly" is 100%, a uniform analogue function (defined by the poly meander resistance) is defined between the two, which effectively provides, in a single analogue measurement at a given voltage, the required parametric data to enable the critical poly-to-contact distance (or an acceptable margin in respect thereof) can be determined in respect of the integrated circuit die of interest; or, in other words, the degree of misalignment of (or the resultant effective distance between) the layers forming the poly region and the contact region respectively of the integrated circuit die can be thereby quantified in terms of a probability of a poly-to-contact short as a result thereof.

Terminal B can be used to measure the total meander resistance, but this additional measurement is not strictly necessary.

The fact that test structure described above requires a minimal number of pads and only one single measurement, makes it very cost effective for measuring poly-to-contact shorting issues. It will be appreciated that, although in the exemplary embodiment illustrated in FIG. 2 of the drawings, each contact set 16a to d comprises 4 contacts 16, a different number of contacts may be used in respect of each set, and the invention is not intended to be limited in any way in this regard.

The basic concept of the test structure of the invention can equally be used for via-to-metal overlay in device structures such as those shown in FIGS. 4a and 4b. FIG. 4a illustrates a device structure comprising two parallel sets of metal lines, the first (or bottom) one being denoted by reference numeral 20 and the second (or top) one being denoted by reference numeral 22, wherein corresponding top and bottom lines 20, 22 are connected by a via 24. As shown, metal-to-via shorts can occur between a bottom metal line 20 and the via 24 (FIG. 4a) or between a top metal line 22 and the via 24 (FIG. 4b), and d in FIGS. 4a and 4b denotes the via-to-metal short critical distance with respect to the bottom metal line 20 and the top metal line 22, respectively.

Figure 5:
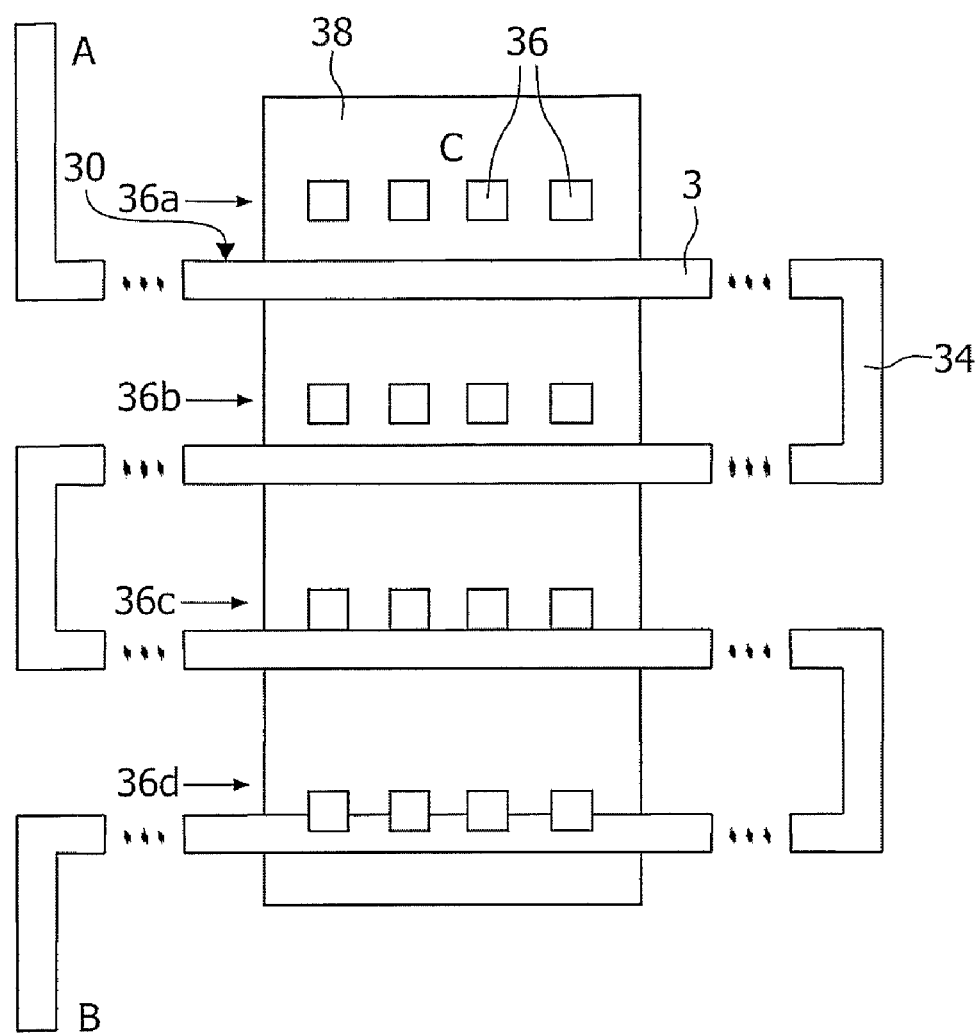
FIG. 5 is a schematic plan view of an electrical test structure according to a second exemplary embodiment of the present invention for use in measuring via-to-metal alignment.

Referring to FIG. 5 of the drawings, an electrical test structure according to an exemplary embodiment of the present invention for use in measuring via-to-metal alignment is analogous to that described with reference to FIG. 2 of the drawings for use in measuring poly-to-contact alignment. Thus, the structure comprises a metal line 30 of relatively narrow width in a meandering configuration (the length of which is adapted to account for the metal sheet resistivity), the metal line 30 comprising a plurality of substantially parallel, substantially horizontal regions 32 and a plurality of connecting portions 34, between a first end A and a second end B.

With respect to each horizontal region 32 of the metal line 30, a set of vias 36 is provided, the via sets being placed at different distances relative to respective horizontal regions 32, as shown. It will be appreciated that the vias 36 are provided on a second, relatively wide metal line 38. In the exemplary embodiment illustrated in FIG. 5, the distance between each via set 36a to 36d and the respective horizontal region 32 of the metal line 30 decreases sequentially, as described with reference to the exemplary test structure described with reference to FIG. 2 of the drawings. As before, a single measurement of the resistance between terminal A (first end of the metal meander 30) and terminal C (on the second metal line 38) is sufficient to estimate the length of metal meander 30 until the first shorting via group. In other words, a single measurement between terminals A and C is sufficient to determine the critical via-to-metal distance d. Thus, the via-to-metal margin can be quantified immediately.

Figure 6:
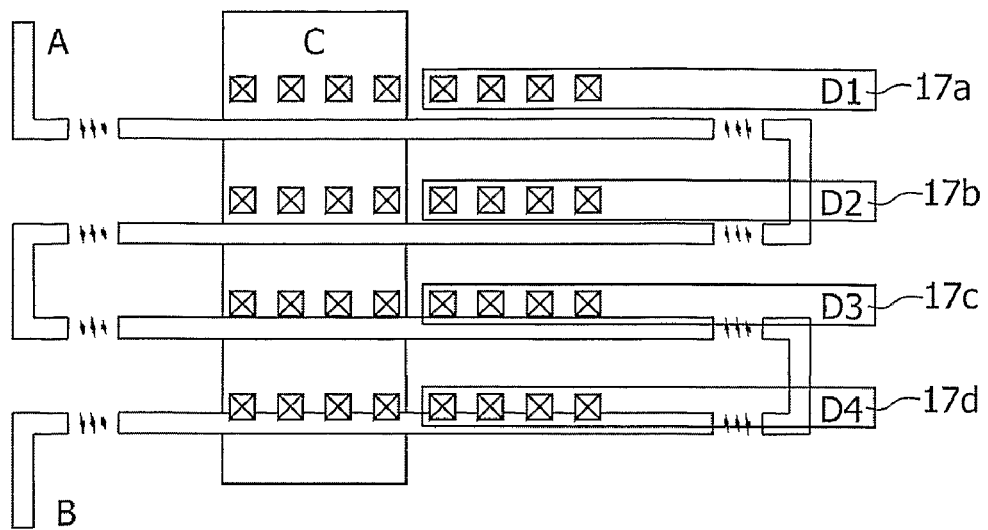
FIG. 6 is a schematic plan view of an electrical test structure according to a third exemplary embodiment of the present invention for use in measuring poly-to-contact alignment.

Referring to FIG. 6 of the drawings, a test structure according to a third exemplary embodiment of the present invention (for use in measuring poly-to-contact alignment in this case, but the same principle applies to an analogous test structure for measuring via-to-metal alignment) is similar in many respects to the test structure illustrated in FIG. 2 of the drawings, and like elements thereof are denoted by like reference numerals. However, in this case, a number of additional terminals 17a, 17b, 17c, 17d (or "fingers") are provided, one in respect of each contact set 16a, 16b, 16c, 16d. These "fingers" can be used to measure individual resistances between respective contact sets and terminal A (i.e. terminal A to terminal D1, terminal A to terminal D2, etc.), which individual measurements can be used to calibrate the test structure.

Figure 7:
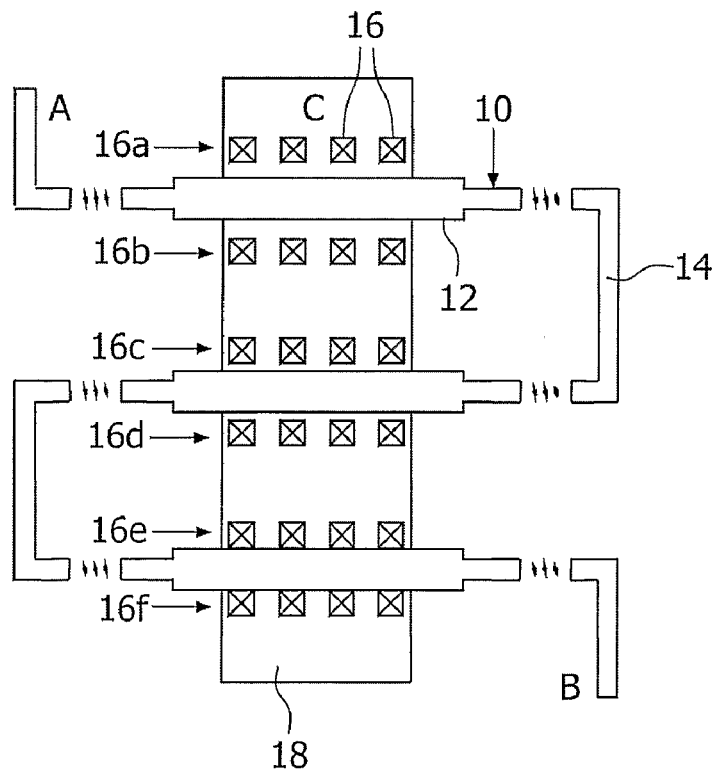
FIG. 7 is a schematic plan view of an electrical test structure according to a fourth exemplary embodiment of the present invention for use in measuring poly-to-contact alignment.

Referring to FIG. 7 of the drawings, a test structure according to a fourth exemplary embodiment of the present invention (again for use in measuring poly-to-contact alignment in this case, but the same principle applies to an analogous test structure for measuring via-to-metal alignment) is similar in many respects to the test structure illustrated in FIG. 2 of the drawings, and like elements thereof are denoted by like reference numerals. However, in this case, two sets of contacts 16 are provided in respect of each horizontal region 12 of the poly meander 10, one set on either side of each respective horizontal region 12. This enables positive and negative misalignment to be measured at the same time. In this case, the width of the poly meander 10 may need to be adapted in order to allow for the minimum contact-to-contact distance as specified by the design rules (i.e. in the illustrated example, the poly 10 is wider in the portions neighboring the contacts).

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of obtaining parametric test data for use in monitoring alignment of first and second layers of material successively deposited on a substrate defining two respective non-contacting component types on an integrated circuit die, the method comprising:
    providing a test structure comprising a conductive first line a second line of the material of said first layer of material, and a plurality of component regions each component region comprising one or more components defined by said second layer of material and being provided on said conductive first line relative to said second line of material, wherein a first component region is located at a first distance from said second line of material and a second component region is located in contact with second line of material, said second line of material defining a resistance between said first and second component regions
    performing a single analogue measurement between said conductive first line and said second line of material so as to measure the resistance therebetween, said resistance being indicative of a probability of a short circuit occurring between said first and second layers of material depending upon the distance therebetween.

2. A method according to claim 1, wherein one or more third component regions are located between said first and second component regions said one or more third component regions being located at a distance from said second line of material which is less than said first distance.

3. A method according to claim 2, wherein two or more third component regions located between said first and second component regions at successively smaller distances from said second line of material.

4. A method according to claim 1, wherein the resistance of said second line of material between the or each pair of component regions is at least of the order of the resistance of a short circuit between said first and second layers of material.

5. A method according to claim 1, wherein the resistance of the second line of material is dependent upon the respective length of the second line of material.

6. A method according to claim 1, wherein the second line of material is provided in a meandering configuration, having two or more elongate portions, with respective connecting portions therebetween.

7. A method according to claim 6, wherein the least one component region is provided in respect of each elongate portion of said second line of material.

8. A method according to claim 6, wherein said elongate portions of said second line of material are transverse to the conductive first line of material.

9. A method according to claim 1, wherein each component region comprises a row of respective components located relative to a respective elongate portion of said second line of material.

10. A method according to claim 1, wherein two component regions are provided in respect of each elongate portion of said second line of material, one on each side thereof.

11. A method according to claim 1, wherein said single analogue measurement is obtained between a first end of said second line of material and said conductive first line of material.

12. A method according to claim 11, wherein additional measurements are performed between said first end and a second end of said second line of material to determine the total resistance of said second line of material.

13. A method according to claim 11, wherein measurements are performed in respect of the individual resistances of selected portions of said second line of material, so as to enable the test structure to be calibrated.

14. A test structure for use in a method according to claim 1, the test structure comprising a conductive first line, a second line of the material of said first layer of material, and a plurality of component regions, each component region comprising one or more components defined by said second layer of material and being provided on said conductive first line relative to said second line of material, wherein a first component region is located at a first distance from said second line of material and a second component region is located in contact with said second line of material, said second line of material defining a resistance between said first and second component regions the test structure further comprising means for enabling a single analogue measurement to be performed between said conductive first line and said second line of material so as to measure the resistance therebetween.

15. A method of monitoring alignment of first and second deposited layers of a semiconductor device structure using parametric data obtained by means of a method according to claim 1.

16. Apparatus for monitoring alignment of first and second deposited layers of a semiconductor device structure using parametric data obtained by means of a method according to claim 1.

17. A method of fabricating an integrated circuit die comprising a plurality of semiconductor device structures, the method including monitoring alignment of first and second deposited layers of one or more of the semiconductor device structures using parametric data obtained by means of a method according to claim 1.

18. An integrated circuit die manufactured by means of a method according to claim 17.

* * * * *